United States Patent
Kub et al.

(10) Patent No.: US 7,535,100 B2
(45) Date of Patent: May 19, 2009

(54) WAFER BONDING OF THINNED ELECTRONIC MATERIALS AND CIRCUITS TO HIGH PERFORMANCE SUBSTRATES

(75) Inventors: Francis J. Kub, Arnold, MD (US); Karl D. Hobart, UpperMarlboro, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 91 days.

(21) Appl. No.: 10/457,692

(22) Filed: May 20, 2003

(65) Prior Publication Data
US 2004/0009649 A1 Jan. 15, 2004

Related U.S. Application Data

(60) Provisional application No. 60/395,340, filed on Jul. 12, 2002.

(51) Int. Cl.
H01L 23/34 (2006.01)
(52) U.S. Cl. .................. 257/728; 257/275; 257/625; 257/E27.137; 257/E27.144
(58) Field of Classification Search ............ 257/57, 257/77, 194, 728, 723–725, 275, 782, 625, 257/676, E27.137, E27.144, E23.021, E23.062; 117/94
See application file for complete search history.

(56) References Cited

U.S. PATENT DOCUMENTS

| | | | | |
|---|---|---|---|---|
| 4,737,236 A | * | 4/1988 | Perko et al. ................ 216/18 |
| 4,930,347 A | * | 6/1990 | Henderson ............ 73/170.12 |
| 5,021,300 A | * | 6/1991 | Stacey .................... 428/620 |
| 5,292,686 A | | 3/1994 | Riley et al. |
| 5,652,173 A | * | 7/1997 | Kim ....................... 438/381 |
| 5,658,809 A | * | 8/1997 | Nakashima et al. ........ 438/766 |
| 5,869,387 A | * | 2/1999 | Sato et al. ................ 438/459 |
| 5,877,070 A | * | 3/1999 | Goesele et al. ........... 438/458 |
| 5,949,140 A | * | 9/1999 | Nishi et al. .............. 257/728 |

(Continued)

FOREIGN PATENT DOCUMENTS

JP 02191954 1/1989

(Continued)

OTHER PUBLICATIONS

Dohle et al., "A New Bonding Technique for Microwave Devices", IEEE Transactions on Components, Packaging, and Manufacturing Technology, 1996, pp. 57-63 vol. 19.

*Primary Examiner*—Thanhha Pham
(74) *Attorney, Agent, or Firm*—John J. Karasek; Joseph T. Grunkemeyer

(57) ABSTRACT

A method of bonding a wafer to a substrate comprising the steps of: providing a wafer having a front surface and a back surface; attaching the front surface of the wafer to a support; thinning the wafer from the back surface; bonding the back surface of the wafer to a substrate using a thin bonding technique; and removing the support from the front surface of the wafer. A circuit comprising: a substrate; and a wafer; wherein the wafer is at most about 50 microns thick; wherein the wafer has a front surface comprising features; and wherein the wafer has a back surface bonded to the substrate using a thin bonding technique.

14 Claims, 3 Drawing Sheets

U.S. PATENT DOCUMENTS

| | | | |
|---|---|---|---|
| 6,013,534 A | 1/2000 | Mountain | |
| 6,094,458 A * | 7/2000 | Hellberg | 375/242 |
| 6,162,701 A | 12/2000 | Usami et al. | |
| 6,187,611 B1 * | 2/2001 | Preston et al. | 438/106 |
| 6,328,796 B1 | 12/2001 | Kub et al. | |
| 6,492,195 B2 | 12/2002 | Nakanishi et al. | |

FOREIGN PATENT DOCUMENTS

| | | |
|---|---|---|
| JP | 06175359 | 12/1992 |

* cited by examiner

WAFER BONDING OF THINNED ELECTRONIC MATERIALS AND CIRCUITS TO HIGH PERFORMANCE SUBSTRATES

This application claims priority to U.S. Provisional Patent Application No. 60/395,340 filed on Jul. 12, 2002

BACKGROUND OF THE INVENTION

1. Field of the Invention

The invention relates generally to wafer bonding of a wafer to a substrate.

2. Description of the Prior Art

There are several microelectronic and microwave devices that are formed on a silicon substrate that would benefit from the use of a high thermal conductivity, microwave insulating substrate instead of a silicon substrate. GaN High Electron Mobility Transistors (HEMT) are currently being grown on silicon wafers with a <111> wafer orientation, and have the feature of high electron mobility and transconductance. However, their performance in microwave circuit applications suffers because of microwave losses in transmission lines and the poor quality factor ("Q") of inductors that are formed over the silicon substrate, since the silicon substrate is not obtainable as either insulating or semi-insulating. There are microwave losses in transmission lines and degraded quality factor even in the case that a high resistivity substrate in the range of 3000-10,000 ohm-cm resistivity is used. The power output capability from GaN HEMT transistors is strongly dependent on thermal conductivity of the substrate. The thermal conductivity of a silicon substrate is 140 W/mK. The other substrate that is typically used for GaN HEMT growth is a semi-insulating SiC substrate that has a thermal conductivity of approximately 300 W/mK. Semi-insulating SiC may be expensive and only available in small sizes.

Transmission line propagation issues and poor "Q" also exist for CMOS, BiCMOS, and SiGe Heterojunction Bipolar Transistor (HBT) circuits fabricated using silicon or Silicon-on-Insulator (SOI) substrates. High speed microprocessors suffer from enhanced propagation delay in the transmission of electrical signals on metal interconnects due to microwave loss issues in the non-insulating silicon substrate. In addition, wireless and mixed-signal RF circuits are frequently fabricated on silicon substrate. The "Q" of inductors in these wireless and mixed-signal circuits is degraded because these circuits are fabricated on a non-insulating silicon substrate. Silicon mixed signal circuits suffer from a problem of cross talk from the digital circuit to the analog circuit. It would be desirable to fabricate mixed-signal circuits on an insulating substrate to reduce cross talk effects. Silicon microprocessor circuits are currently becoming thermally limited. It would be desirable to implement silicon circuitry on a high thermal conductivity substrate.

There are a smaller number of applications, such as discrete microwave power transistors, where it is desirable to implement microwave transistors on a high thermal conductivity substrate. However, for these applications the substrate does not have to be insulating. The microwave transmission line matching circuits are typically implemented on a microwave board. The applications for discrete microwave transistors include microwave base stations, high power L- and S-band solid-state radars, cellular base stations, and C-band communication links. In the case of vertical current transport Si bipolar or SiGe HBT power transistors, it is desirable that the substrate be electrically conductive (and highly thermally conductive) in order make electrical contact to the collector.

High performance microwave transistors and circuits are often formed by epitaxial growth and device fabrication on GaAs, InP, or GaInAs substrates. The thermal conductivity of GaAs and InP substrates is relatively poor (on the order of 50-60 W/mK). The output power for a microwave transistor is often strongly dependent on the thermal conductivity of the substrate. Thus, it would be desirable to replace a significant portion of the GaAs or InP substrate with a high thermal conductivity, microwave insulating substrate.

There are four primary types of wafer bonding. These include 1) direct wafer bonding with atom-to-atom bonding, 2) direct wafer bonding with thin bonding material layer, 3) polymer wafer bonding, and 4) metal direct bonding. Standard packaging approaches also use a form of bonding to perform die attach. Typical die attach material include eutectics, epoxy, metal filled epoxy, ceramic filled epoxy, solder, phase change material, and silver glass. Die attach materials are typically greater than 25 microns thick. The general approach to improve the thermal conductivity of the die attach material is to use metal (typically silver) filled epoxy or ceramic (such as boron nitride) filled epoxy. The thermal conductivity of the ceramic filled epoxy is generally in the range of 1-10 W/mK.

SUMMARY OF THE INVENTION

The invention comprises a method of bonding a wafer to a substrate comprising the steps of: providing a wafer having a front surface and a back surface; attaching the front surface of the wafer to a support; thinning the wafer from the back surface; bonding the back surface of the wafer to a substrate using a thin bonding technique; and removing the support from the front surface of the wafer.

The invention further comprises a circuit comprising: a substrate; and a wafer; wherein the wafer is at most about 50 microns thick; wherein the wafer has a front surface comprising features; wherein the wafer has a back surface bonded to the substrate using a thin bonding technique.

DETAILED DESCRIPTION OF EXAMPLE EMBODIMENTS

Figure 1A:
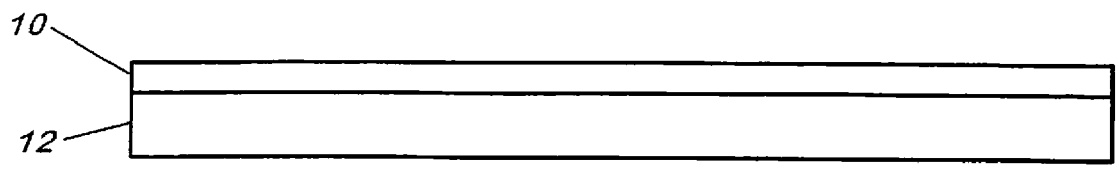
FIGS. 1a-1j schematically illustrate the steps of an embodiment of the invention.

The invention comprises a method of bonding a semiconductor wafer to substrate, specifically a high performance substrate for microelectronic and/or microwave material layers, devices, or circuits. The high performance substrate may provide microelectronic or microwave material layers, devices, or circuits with a microwave insulating, a high thermal conductivity substrate, or both microwave insulating and highly thermally conductive. The high performance substrate may also be optically transparent.

The approach comprises substantially removing a large portion of the wafer upon which microelectronic or microwave materials, devices, or circuits are fabricated by thinning (optionally with the use of an etch stop layer) and then wafer bonding a high performance substrate (single crystal, polycrystalline, or composite polycrystalline substrate) to the backside of the wafer. The high performance substrate can be either microwave insulating, highly thermally conductive, optically transparent, or both microwave insulating and highly thermally conductive. In addition, to be compatible with typical silicon wafer diameters (12 inches) and GaAs wafer diameters (six inches), the high performance substrate may have a large diameter.

A high thermal conductivity, insulating substrate may have tremendous advantages for silicon, GaN, GaAs, GaInAs, InP, InAs, GaSb, and InSb microelectronic and microwave circuits. Possible advantages may include, but are not limited to, the following.

- Silicon microwave and RF circuits with high quality factor inductors and low microwave transmission line loss.
- Silicon mixed-signal circuits with low cross talk between digital and analog circuits.
- High performance silicon microprocessors. Silicon microprocessors are currently limited in their performance because of the thermal conductivity of the silicon substrate. A substrate with high thermal conductivity may allow enhanced performance.
- Transmission line microwave loss effects in a silicon substrate cause signal propagation delay on metal interconnects that can affect the performance of silicon microprocessors. An insulating substrate may help to eliminate signal propagation delay effects.
- High thermal conductivity substrates that may allow high speed SiGe HBT analog-to-digital converters and high microwave power amplifiers.
- A high thermal conductivity substrate may provide higher microwave output power for silicon, GaN, GaAs, GaInAs, and InP microwave circuits. Microwave output power is strongly dependent on the thermal conductivity of the substrate.
- Large diameter, microwave insulating, high thermal conductivity substrate for GaN HEMT technology that is fabricated on a silicon substrate with <111> orientation.
- For the approach of only growing an epitaxial layer and potentially several device layers on the wafer, the wafer thickness can be reduced significantly from that typically required for mechanical strength to survive device processing operations. There is the potential for reduced substrate cost because more substrates may be obtained from a single boule.
- Multiple small diameter substrates such as GaInAs, InP, InAs, GaSb, and InSb substrates containing optional epitaxial layers may be thinned and wafer bonded to a large diameter high performance substrate. Processing of multiple substrates may be completed simultaneously.

At a minimum, the method of the invention comprises the steps of providing a wafer having a front surface and a back surface; attaching the front surface of the wafer to a support; thinning the wafer from the back surface; bonding the back surface of the wafer to a substrate; and removing the support from the front surface of the wafer. Other optional steps may also be performed. The optional steps may be performed in any feasible sequence.

Providing a Wafer

In the providing step, the suitable wafers may comprise, but are not limited to, silicon, thick SOI, thin SOI, silicon substrate layer with an SiGeC etch stop layer, GaAs, GaAs substrate with an etch stop layer, InP, In As, InGaAs, InSb, GaSb, ZnO, sapphire, and any other material on which electronic structures may be fabricated. The front surface of the wafer may comprise features such as microelectronic or microwave material layers, devices, or circuits, optoelectronic layers, LED's, lasers, and combinations thereof. As used herein, the term "features" includes, but is not limited to, device structures, active regions, material layers, circuits, and any other components or materials that may be fabricated on a wafer. The features may be fabricated as part of the process of the invention, or they may be preexisting on the wafer. At this point in the method, all desired features may already be fabricated, the features may be only partially complete, or no features may be present.

The wafer may comprise one or more etch stop layers. Typical etch stop layers for silicon substrate technology include, but are not limited to, silicon oxide layer, SiGe layer, SiGeC layer, carbon layer, silicon nitride layer, heavily boron doped layer, boron doped SiGe or SiGeC layer, and PN junction for galvanic etch stop or electrochemical etch stop. Typical etch stop layers for GaAs technology include AlGaAs and InGaP. The etch stop layer can be implemented either close to the front surface so that there is thin amount of wafer material near the front surface. An example is thin SOI, which may have a silicon device layer thickness in the range of 2 nm to 500 nm. The etch stop layer may also be deeper so that there is a larger amount of wafer material near the front surface. An example is thick SOI, which may have a silicon layer thickness in the range of 500 nm to 40 µm. The thick SOI approach allows for a CMP polish on the thick silicon material that can remove several microns of silicon during the CMP polishing operation. Typical etch stop layers for GaAs technology include AlGaAs and InGaP.

For silicon technology with a silicon oxide etch stop layer, an SOI CMOS circuit may be fabricated. For silicon technology without an etch stop layer, a twin well CMOS circuit may be fabricated. Other common silicon circuit types that may benefit from a wafer bonded microwave insulating, high thermal conductivity substrate are SiGeC heterojunction bipolar transistor (HBT) mixed-signal and RF circuit, a SiGe HEMT, SiGeC HBT, silicon MOSFET technology, and silicon RF circuits. HBT and HEMT circuits in GaAs, GaInAs, InP, InAs, InSb, and GaSb technologies may also benefit from a wafer bonded microwave insulating, high thermal conductivity substrate. The wafer can have material layers consisting of epitaxial layers and/or device layers grown on the front surface prior to thinning. In addition, microelectronic and/or microwave devices can be partially or completely fabricated on the wafer prior to thinning. These microelectronic and/or microwave circuits can be fabricated either in the epitaxial layer or layers grown on the front surface or in the wafer bulk material. Because of the topography on the wafer that arises from device layers, it may be beneficial to only grow the epitaxial layers or partially fabricate the device layers prior to the thinning operation in order to allow a more planar surface and repeatable thickness of the devices layers. An additional reason to only grow the epitaxial layers or to partially fabricate the device prior to the thinning operation is that some substrates are fragile and there will be a higher processing yield if a thinned wafer is wafer bonded to a strong mechanical strength high performance substrate. In addition, several technologies such as InP, InAs, InSb, and GaSb may be available only in small diameters such as two or three inches. It may be desirable to bond multiple thinned wafers containing epitaxial layers or device layers at laterally separated locations to a large diameter high performance substrate for more economical processing of the remaining epitaxial and/or device material layers.

Reducing Stress in Front Surface

Optionally, the method comprises processing the front surface to reduce stress in the front surface. The processing may include, but is not limited to etching grooves or laser drilling through the material layers on the front surface. The material layers may also be grown using techniques such that the material is confined to small lateral dimension regions. The purpose of the processing is so that the material layers on the front surface of the wafer are separated into small lateral dimension regions in order to the reduce stress in the material layers to reduce bowing of the wafer. Bowing of the wafer can be caused by material that has either tensile or compressive strain that is located on the surface of the wafer. This may be the result of mismatched thermal expansion coefficients between the wafer and the material layers on the surface. Reducing bowing of the wafer may aid in attaching a wafer containing material layers, devices, or circuits to a support. Pressure may be used to attach the wafer to the support. If the material layers on the wafer are highly strained, the material layers can crack during the application of pressure. Any grooves present on the front surface may be deep enough such that, after the thinning step, the wafer is divided into discrete islands that are attached to the support.

Optionally, the method comprises applying a low stress material to the front surface. This may be done as an alternative to, or in addition to, the step of processing the front surface. The low stress material may have mechanical strengthening or stiffening properties. The attaching step may use an adhesive material to attach the front surface of the wafer to a support substrate. The adhesive material may have stresses that can distort the wafer after the wafer is thinned. The purpose of the low stress material is to displace the adhesive material from the surface of the wafer and to provide additional mechanical support to the wafer.

Suitable low stress materials may comprise polymer or inorganic material. Polyimide is a suitable low stress material. Methods for applying the low stress material on the wafer include, but are not limited to, spin coating, spray coating, depositing, and applying as a sheet or tape. Suitable low stress materials impart low stress to the wafer and have a thermal expansion coefficient that is relatively closely matched to the thermal expansion coefficient of the wafer or material layers on the wafer. The low stress material layer may generally be removed by dissolving, etching, or peeling after the thinned wafer is bonded to the substrate.

Attaching the Wafer to a Support

The front surface of the wafer is then attached to a support. The support may be, but is not limited to, a vacuum or electrostatic chuck, a tool platen, or a substrate such as a silicon wafer, glass, or quartz. The attaching may be done using a temporary dissolvable, softening, or releasable adhesive such as, but not limited to, wax, thermoplastic, polymer, heat releasable adhesive, or UV releasable adhesive. The support and the adhesive may be the same member, as when the support is wax. Multiple wafers can be attached to a single support at selected lateral locations. The adhesive may be released at the completion of processing by heating beyond the softening point of the adhesive or dissolving the adhesive. The use of perforated holes in the support substrate may facilitate the dissolving of the adhesive, although this may result in less adhesive strength during other steps. One approach for manufacturing is to have one tool or a series of cluster tools that perform the processing operations. The front surface of a wafer is attached to a support substrate or a platen. The series of processing operation such as thinning, polishing, wafer bonding, and removing from the support substrate would then be carried out.

The adhesive may also be a compound that can be caused to release the wafer under certain circumstances, such as heating or exposure to laser, UV, or other light. The heat or light may alter the adhesive, rather then melting it, such that it no longer adheres to the wafer or support or both. For example, the heat or light may break chemical bonds within a polymeric adhesive, such that the adhesive is no longer cohesive. An example of such an adhesive is Revalpha thermal release tape from Nitto Denko. Such an adhesive may be used with a support that is transparent to the light used to release the adhesive.

Thinning the Wafer

The wafer is then thinned from the back surface. The wafer may be thinned to a thickness in the range of 100 µm to 50 µm to 20 µm to 500 nm to 2 nm. The use of an etch stop layer may facilitate thinning to a repeatable wafer thickness. A suitable process for thinning with an etch stop layer is to first lap, grind, chemical etch, or plasma etch the wafer to a thickness on the order of 20 to 50 µm. Chemical etching, plasma etching, galvanic etching, or electrochemical etching can be used to stop the thinning at the etch stop location.

An example would be a thin SOI wafer in which the silicon substrate is etched to the buried oxide layer and the surface roughness of the buried oxide surface is sufficiently smooth for direct wafer bonding. A buried GaAs layer is another example.

Multiple etch stop layers can be used to achieve enhanced etch stop ability or improved device or circuit performance. For example, a silicon-on-insulator substrate may have multiple silicon oxide etch stop layers. Below the silicon (or combination of silicon and silicon germanium) device transport layer at the surface may be a thin silicon oxide layer, followed by an intermediate silicon or polysilicon layer, followed by a buried thicker silicon oxide etch stop layer. It is may be desirable, from device performance considerations, to have a selected thickness of silicon oxide beneath the silicon device transport layer. The use of multiple etch stop layers facilitates achieving the selected silicon oxide layer thickness since this oxide layer is not exposed to chemical etchants or CMT polishing. Other multiple etch stop layer combinations exist such as a silicon-on-insulator substrate that has a heavily boron doped layer immediately below the buried silicon oxide layer, or a heavily boron doped layer beneath a SiGe or SiGeC etch stop layer.

The thinning method for a wafer that does not have an etch stop layer may be, but is not limited to, grinding, lapping, chemical etching, or plasma etching to a selected thickness on the order of approximately 0.5 microns to 100 microns. In the case of a bulk wafer without an etch stop layer, in situ mechanical or optical measurement techniques can optionally be used to aid the thinning of the wafer to the selected thickness. For the case that lapping and grinding are performed for thinning, it may be desirable to following the lapping and grinding set by a chemical etch. This may remove the lapping and grinding damage in the wafer and thereby remove stresses at the back surface of the wafer that result from the grinding and lapping damage.

These thinning techniques allow for thinning an entire continuous wafer, as they thin from the back surface. Lateral etching would require that the wafer be cut into separate islands before the etching.

Processing Back Surface

Optionally, the method comprises removing an etch stop layer once it is exposed by the thinning step. The etch stop layer can be removed and the thinned back surface chemical mechanical polished to achieve a small surface roughness. For the case of thick SOI wafer, the oxide etch stop layer can be removed and several microns of silicon removed during the CMP polishing operation.

Optionally, the method comprises forming features on the back surface of the wafer after the thinning step. The features may be formed by a variety of methods including, but not limited to, depositing materials at low temperatures, performing photosteps on the back surface, and performing implantation on the back surface.

One or more materials may be deposited at low temperatures on the back surface of the thinned wafer. The materials can include, but are not limited to, dielectric, conductive, and metallic materials. Several examples of applications of the deposited material layer include: metallic material deposited on the backside of the thinned wafer to provide a ground plane and lateral electric current conductor to minimize latch up, analog cross talk, and provide a conductive path for avalanche generated carriers for silicon CMOS circuits; metallic layers to provide ground plane for transmission lines, metallic layers to provide reduced lateral conductance for buried SiGe HBT collectors; and dielectric material deposited and planarized by CMP to provide a surface with small surface roughness for direct wafer bonding. The material deposition temperature may be below the melting or releasing temperature of the adhesive that attaches the front surface of the wafer to the support substrate.

Photosteps may be performed on the back surface of the thinned wafer while the wafer is attached to the support substrate. One potential application of photosteps is to define a conductive or metallic layer on the back surface so that the conductive or metallic material is confined to the area of the active devices and/or transmission lines in order not to not degrade the quality factor of inductors. When a ground plane for transmission lines is formed on the backside of the high performance substrate, a metallic layer on the back surface of the wafer can be defined so that it is not in the area beneath the transmission line. For SOI devices, a photostep can be used to define a back surface gate for SOI MOSFET devices so that there is a gate both on the front surface and on the back surface of the SOI MOSFET that are coincident on both sides of the silicon device channel layer. To form an SOI MOSFET with a gate on both the front and back surfaces, a process that uses a multiple etch stop to form a conductive polysilicon gate on the back surface of the buried oxide may be used. The material layers on the front surface of the wafer may consist of a silicon oxide layer, a doped polysilicon layer, a second oxide layer, and a wafer-bonded silicon single-crystal device layer 2 nm to 500 nm thick. The process to form a gate on the back surface of a SOI MOSFET is to thin the wafer containing the multiple silicon oxide etch stop layers to a first silicon oxide etch stop layer, remove the oxide etch stop layer by etching, perform a photostep so that the backside gate is aligned with a gate electrode on the front side of the SOI MOSFET, and perform an etching operation to etch the doped polysilicon layer to the silicon oxide layer that is on the back surface of the silicon device layer to implement the back surface gate. Alternately, a metal gate electrode can be photodefined to form the back surface gate of a SOI MOSFET that is aligned to be coincident with the SOI MOSFET front surface gate. Because the photostep creates topography on the back surface of the thinned wafer, material layers may have to be deposited and polished to obtain a sufficiently low surface roughness for direct wafer bonding. The material layers may have a high thermal conductivity and may be a thin layer of silicon oxide followed by a silicon nitride followed by an amorphous or polycrystalline silicon layer deposition. The amorphous silicon may convert to polycrystalline silicon during subsequent annealing steps that follow the wafer bonding operation.

An ion implantation process may be performed on the back surface of the thinned wafer. A proton, argon, carbon, oxygen, or silicon implantation can be performed to increase the resistivity of the silicon in the region of the implant. For example, silicon resistivities of $1\times10^6$ ohm-cm have been obtained by proton implantation into silicon. It is generally desirable that the silicon device region be exposed to only a small implantation dose or no dose. Implantation can also be performed to make a heavily doped region to lower the contact resistance for a metallic layer that is optionally deposited on the back surface of the thinned wafer.

Optionally, the method comprises depositing a leakage current blocking insulator material layer either on the back surface of the thinned wafer, the surface of the substrate, or on both surfaces. A specific example is Au, Ag, or Li doped silicon to form a high resistivity silicon substrate. A silicon substrate with high resistivity can be achieved by doping the silicon with Au, Ag, or Li. However, the Au, Ag, and Li deep level trapping sites will also general a high level of minority carrier generated leakage current. This leakage current can be blocked from diffusing into the device layer of the disclosed approach by depositing an insulator layer such as silicon nitride or silicon oxide on the surface of the substrate that is to be bonded to the back surface of the thinned wafer.

Optionally, the method comprises reducing the surface roughness the back surface of the wafer. Direct wafer bonding with atom-to-atom bonding and with thin material layer bonding may require a small surface roughness.

Suitable surface roughness reduction methods include, but are not limited to, polishing, etching to an etch stop layer, cluster ion bombardment, or etching to an etch stop layer followed by a polishing operation. Chemical mechanical polishing may be used on the backside of the thinned first surface to achieve a surface roughness less than 1 nm rms if direct bonding with atom-to-atom bonding is used. Cluster ion beam may be an alternate approach to reduce the surface roughness. The surface roughness reduction technique may have a processing temperature below the melting or releasing temperature of adhesive that attaches the front side of the wafer to the support substrate.

Several approaches can be used to obtain a small surface roughness for a wafer with an etch stop layer. Chemical etching to the etch stop material layer can result in small surface roughness. An example would be a thin SOI wafer in which the silicon substrate is etched to the buried oxide layer and the surface roughness of the buried oxide surface is sufficiently smooth for direct wafer bonding. Alternately, an etch stop material layer can be chemical mechanical polished to achieve a small surface roughness.

Substrate

The substrate that is bonded to the thinned wafer upon which a microelectronic or microwave material, devices, or circuit is fabricated may be a high performance substrate. As used herein, the term "high performance substrate" means a substrate having the properties of microwave insulating, highly thermally conductive, or both microwave insulating and highly thermally conductive. In addition, in some cases an optically transparent substrate is used as a high performance substrate when a Light Emitting Diode (LED) or vertical emitting laser is fabricated on the surface of the wafer.

The substrate may have a thermal conductivity or a resistivity that is higher than that of the wafer. The thermal conductivity may be at least about 150 W/mK and the resistivity may be at least about 3000 ohm-cm or at least about 10,000 ohm-cm. In some embodiments, the thermal conductivity of a high resistivity substrate may be only at least about 1 W/mK. The thermal conductivity of AlN substrates is about 180 W/mK. Since the microwave power output may be strongly dependent on the thermal conductivity of the substrate, improved X-band to Ku-band amplifiers can result. To be compatible with typical silicon wafers diameters (300 mm) and GaAs wafer diameters (six inches), the high performance substrate may have a large diameter.

It may be desirable for some of the high performance substrates to deposit a leakage current blocking insulator material layer on the surface of the substrate to block the minority carrier leakage current that may be generated in the substrate, as described above.

In some cases, it may be desirable to deposit a high conductivity metal layer on the surface of the substrate prior to bonding to the thinned wafer to implement a ground plane for microwave circuits.

The high performance substrates can consist of a non-single crystal substrate, ceramic polycrystalline substrate, polycrystalline substrate (CVD, plasma, plasma spray, hot filament, hydride vapor phase deposited), composite polycrystalline substrate, composite single-crystal substrate or single crystal substrate, composite polycrystalline layer on single-crystal substrate, or amorphous substrate. Table 1 lists several kinds of high performance substrates.

TABLE 1

| High Performance Substrate Type | Examples |
| --- | --- |
| Ceramic polycrystalline substrate | Polycrystalline AlN, SiC, BN, silicon nitride substrate or combinations of the above ceramic materials |
| Polycrystalline substrate (CVD, plasma, plasma spray, hot filament, hydride vapor phase deposited) | CVD deposited polycrystalline AlN, poly SiC, BN, diamond, polysilicon substrate Hydride vapor phase deposited AlN or GaN Plasma spray deposited diamond Hot filament deposited diamond |
| Composite polycrystalline substrate | CVD AlN, CVD SiC, CVD BN, CVD diamond, plasma spray diamond, hot filament diamond, hydride vapor phase deposited AlN, hydride vapor phase deposited GaN deposition on ceramic or polycrystalline AlN, SiC, BN, or Si substrate |
| Composite single-crystalline substrate | 1-200 µm silicon epitaxial layer on silicon substrate. GaN or AlN epitaxial layer on sapphire substrate GaN or AlN epitaxial layer on ZnO substrate Diamond on silicon substrate |
| Composite polycrystalline layer on single crystal substrate | 10-200 µm polysilicon layer on single-crystal silicon substrate CVD AlN, CVD Sic, CVD BN, CVD diamond, plasma spray diamond, hot filament diamond, hydride vapor phase deposited AlN, hydride vapor phase deposited GaN deposition on single-crystal silicon, sapphire, quartz, Ge, GaAs |
| Single-crystal substrate | Silicon, high resistivity silicon substrate, Au, Ag, Li doped silicon substrate, GaAs, sapphire, SiC, AlN, GaN, Ge, diamond, quartz |
| Silicon substrate with high resistivity layer | Proton implanted silicon Porous silicon layer at silicon substrate surface |
| Amorphous substrate | Quartz Glass |

There are several common methods of forming polycrystalline substrates. The polycrystalline substrate can be a ceramic substrate that is formed by hot pressing or reaction bonding powders in combination with binders. Examples of ceramic substrate materials are ceramic polycrystalline AlN, SiC, BN, silicon nitride substrate or combinations of the above ceramic materials. An advantage of the ceramic polycrystalline substrate is that large diameter substrates (six inch diameter or larger) are available. The ceramic AlN substrate typically has a thermal conductivity of 170-190 W/mK and a resistivity of $10^{13}$ ohm-cm. They can readily be obtained and they have high thermal conductivity.

A polycrystalline substrate can also be formed by chemical vapor deposition (CVD), plasma, plasma spray, hot filament, and hydride vapor phase deposition. Examples include CVD deposited polycrystalline AlN, poly SiC, BN, diamond, polysilicon substrate, hydride vapor phase deposited AlN or GaN, plasma spray deposited diamond, and hot filament deposited diamond. Typical CVD polycrystalline substrates that have the feature of being both electrically insulating and high thermal conductivity include CVD polycrystalline SiC, CVD polycrystalline AlN, CVD polycrystalline boron nitride, and CVD polycrystalline diamond. An example of a CVD substrate is CVD SiC, which typically has a thermal conductivity of approximately 250 W/mK to 300 W/mK, a resistivity of 3000-5000 ohm-cm, and can be obtained in six inch or larger diameters. An example of plasma spray and hot filament substrates are diamond substrates that have a thermal conductivity of approximately 1000 W/mK, a resistivity greater than $10^{10}$ ohm-cm.

A composite polycrystalline substrate can be formed by a combination of depositing a CVD, plasma spray, hot filament, hydride vapor phase deposited polycrystalline material layer on a non-single crystal (polycrystalline, ceramic, or amorphous substrate). Examples include CVD AlN, CVD SiC, CVD BN, CVD diamond, plasma spray diamond, hot filament diamond, hydride vapor phase deposited AlN, and hydride vapor phase deposited GaN deposition on a non-single crystalline (ceramic, polycrystalline, or amorphous) AlN, SiC, BN, Si, or glass substrate. The non-crystalline substrate can be partially or entirely removed by grinding or etching at the completion of the processing to fabricate a device. The partial or complete removal of the non-single crystalline substrate will reduce the thermal impedance of the substrate and can provide lower microwave loss since the deposited polycrystalline layers will have higher thermal conductivity and lower microwave loss than the non-crystalline substrate. The advantage of the composite substrate is that a non-single crystalline substrate can act as the support substrate for a high performance deposited polycrystalline material layer in the range of 1 to 400 microns and more typically 20 to 50 microns so that the entire substrate does not have to be formed by deposition. A CVD, plasma sprayed, hot filament layer, hydride vapor phase deposited material layer will typically have a higher thermal conductivity then can be obtained for a ceramic substrate. For example, a CVD AlN layer will typically have a thermal conductivity of 280 W/mK while the ceramic AlN substrate will typically have a thermal conductivity of 170-190 W/mK. Since the CVD AlN deposited layer has less impurities than the ceramic AlN substrate, the CVD AlN layer can provide reduced microwave loss substrates. Examples of composite substrates include, but not limited to, depositing a CVD AlN layer on a polycrystalline AlN, SiC, or BN substrate, depositing a diamond layer on a polycrystalline AlN, SiC, BN substrate, or depositing a boron nitride layer on a polycrystalline AlN, SiC, BN. The composite polycrystalline substrate is well suited to microwave circuit applications since substrates for microwave circuits are typically thinned to the range of 40 microns to 100 microns. A substrate thickness in the range of 40 microns to 100 microns is desired for many microwave substrates in which the ground plane of a transmission line is formed on the backside of the high performance microwave insulating substrate. Thus, for the case of a composite substrate that has a 40 micron to 100 micron thick CVD AlN layer that is deposited on a ceramic AlN substrate, the entire substrate or a large portion of the substrate after thinning will consist of the high performance CVD or hydride vapor phase deposited material layer (for example, high thermal conductivity CVD AlN layer.)

A composite single-crystal substrate consisting of high resistivity epitaxial layer grown on single-crystal substrate can be a high performance substrate. A specific example is a thick (10-200 micron), high resistivity silicon epitaxial layer grown on single crystal silicon. Currently, a 200 mm diameter float zone substrate is the largest size high resistivity float zone silicon substrates that can be commercially purchased. The approach of growing an epitaxial layer on single crystal silicon is an approach that may allow for high resistivity high performance substrates for substrate diameters greater than 200 mm. After the completion of the processing, the single-crystal substrate upon which the epitaxial layer is grown can be removed by grinding or other processing, leaving a thick epitaxial single-crystal layer as the high performance substrate. Other examples include, but are not limited to, GaN or AlN epitaxial layer on sapphire substrate, GaN or AlN epitaxial layer on ZnO substrate, and diamond on silicon substrate.

A composite polycrystalline/single-crystal substrate consisting of polycrystalline layer grown on single-crystal substrate can be a high performance substrate. A specific example is a thick (1-200 micron), high resistivity polycrystalline silicon layer grown on single crystal silicon. The polycrystalline material layer can be grown on the single-crystal material by growing or depositing a polycrystalline or amorphous material on the single-crystal substrate or by growing the polycrystalline material in such a manner that single-crystal material is not grown on single crystal material. An example is growing a material layer at a sufficiently low temperature that single crystal material is not epitaxially grown on single-crystal material. Currently, a 200 mm diameter float zone substrate is the largest size high resistivity float zone silicon substrates that can be commercially purchased. The approach of growing a thick, polycrystalline material layer on single-crystal silicon is an approach that will allow for high resistivity, high performance substrates for substrate diameters greater than 200 mm. After the completion of the processing, the single-crystal substrate upon which the polycrystalline layer is grown can be removed by grinding or other processing, leaving a thick polycrystalline layer as the high performance substrate. Other examples include CVD AlN, CVD SiC, CVD BN, CVD diamond, plasma spray diamond, hot filament diamond, hydride vapor phase deposited AlN, hydride vapor phase deposited GaN deposition on single-crystal silicon, sapphire, quartz, Ge, and GaAs.

There are several single crystal substrates that are both insulating and high thermal conductivity. These include gold-doped silicon and wide bandgap bulk AlN, GaN, BN, diamond, and SiC substrate. The bulk SiC substrates, available in sizes to 3 inch diameter, have a thermal conductivity of 300-380 W/mK and resistivity greater than $10^5$ ohm-cm. Bulk AlN and GaN substrates are currently being developed. Single-crystal AlN substrates have a thermal conductivity of approximately 280 W/mK and single-crystal GaN substrates have a thermal conductivity of approximately 135 W/mK. There are several single-crystal substrates that are insulating but do not have a high thermal conductivity. Single crystal insulating substrates include sapphire and semi-insulating GaAs substrates.

There are a number of single-crystal substrates that can perform as a high performance substrate. One example is high resistivity float zone silicon. Float zone silicon layers with a resistivity of 10,000-30,000 ohm-cm are commercially available. It would be desirable to fabricate silicon VLSI circuits and maintain the high resistivity properties in the substrate throughout the fabrication process in order to have reduced microwave losses of circuits and interconnects in the substrate. However, it is typically the case that the resistivity of the substrate is reduced during conventional VLSI fabrication operations because of impurities that are diffused into the substrate during the higher process temperature operations. When bonding a high performance substrate to the back surface of a thinned wafer that contains partially or completely processed devices or circuits, the process temperature can be maintained at a sufficiently low temperature so that impurities are not diffused into the substrate. Alternatively, a relatively small number of highly clean process steps that are free of impurities can be performed so that impurities are not incorporated into the silicon substrate and thus the high resistivity properties of the silicon substrates can be maintained.

High resistivity silicon substrates can be obtained by gold, platinum, lithium, or silver doping. The resistivity of N-type gold doped silicon is typically in the range of $1 \times 10^5$ ohm-cm but can be made as high as $1 \times 10^7$ ohm-cm if there are a high level of defect clusters in the silicon. (Hauber et al., "U- and W-shaped diffusion profiles on gold in silicon," *J. Physics C: Solid State Physics*, 19, 5817 (1986), incorporated herein by reference.) Since the high resistivity substrate is bonded to the active device at the completion of processing, defects clusters in the high performance substrate will not degrade the device performance. One way of making defect clusters is to nucleate oxygen precipitates throughout the silicon substrate prior to gold doping. In reality, the top 20-50 microns of silicon substrate are the most critical for obtaining high resistivity since it is closest to the device, transmission lines, and inductors. In addition, the high performance substrate will likely be thinned to 40 to 100 micron thickness at the completion of processing. In addition, proton implant, argon implant, carbon implants, silicon implant, and oxygen implants should be able to create a large amount of defect clusters that can be decorated by gold. Advantages of the gold doped silicon substrate include that it is inexpensive, large diameter substrates are available, and since it is a back end process, it will not contaminate a production facility with gold. RF power circuits on gold-doped silicon substrates may have higher performance than those on silicon-on-sapphire because of the higher thermal conductivity of silicon (140 W/mK) vs sapphire (35 W/mK).

There are several approaches that can be used to obtain a high resistivity layer at surface of a single-crystal silicon substrate. One approach is to form a porous silicon layer at the surface of a silicon substrate. The porous silicon layer can extend into the silicon substrate for a depth of 1 to 100 microns. A second approach is to implant protons into the region of the silicon substrate near the surface. For example, silicon resistivity of $1 \times 10^6$ ohm-cm has been obtained by proton implantation into silicon. One advantage of proton implantation is that deep implantations can be made. It is possible to implant as deep as 200 microns into silicon for a high-energy implanter. It is desirable that the high resistivity portion of the high performance substrate be in the region near and as much as 100 microns deep from the wafer bonding interface. Since the high performance substrate will likely be thinned at the completion of processing, it may be important to create a high resistivity silicon region within 100 microns of the wafer bonding interface.

Examples of composite single-crystal substrate include either single-crystal or polycrystalline AlN, GaN, or SiC (1 micron to 400 micron thick epitaxial layers) grown on sapphire, SiC, or silicon substrates. In addition, a composite insulator/gold-doped silicon substrate can be made by depositing an insulator on the surface of the gold-doped substrate and performing the wafer bond so that the insulator surface is bonded to the backside of the first thinned substrate. Potential insulators that have high thermal conductivity include polysilicon, AlN, BN, and diamond. These insulators would likely be CMP polished after deposition to achieve a low surface roughness. An advantage of the composite insulator/gold-doped silicon substrate is that the electric field in the gold-doped portion of the silicon substrate can be reduced, since it is a greater distance from the active portion of the device or circuit.

One of the advantages of the method may be that the high performance substrate does not require a low defect density, as is the case for device fabrication directly on these substrates. The high performance substrate may only require the properties of high thermal conductivity and insulating properties. Bulk AlN, GaN, BN, diamond, and SiC substrate currently have a high level of material defects (SiC has a high density of micropipes), which degrade the yield of devices fabricated directly on the substrate. Because of the reduced requirement for low defect density, high performance AlN, GaN, and SiC substrates may be more economical to produce.

The "direct wafer bonding" (with atom-to-atom bonding) and "direct wafer bonding with thin bonding material layer" approaches require a small surface roughness on the two surfaces to be bonded. The direct wafer bonding with atom-to-atom bonding typically requires a surface roughness less than approximately 1 nm rms. The direct wafer bonding with thin bonding material layer has relaxed requirements for surface roughness, however, small surface roughness is a key requirement.

Approaches for achieving small surface roughness on high performance substrates include, but are not limited to: 1) polish the surface of the high performance substrate to a small surface roughness, 2) deposit a material layer on a high performance substrate and polish the surface of the material layer, and 3) deposit a material layer on the surface of the high performance substrate and heat to flow the material layer. Examples of materials that flow to achieve a small surface roughness include, but are not limited to, boron-doped glass, borophosphate silicate glass (BPSG), and spin-on-glass. It has been experimentally demonstrated that polycrystalline CVD SiC can be polished to approximately 0.2 nm rms directly. However, other polycrystalline substrate such as ceramic AlN can generally be polished at best to approximately 5 nm rms roughness and more generally 25 nm rms.

An additional requirement for applications requiring high thermal conductivity is that the material layers that are deposited on the high performance substrate and then polished to a small surface roughness should have a high thermal conductivity and also have semiinsulating or insulating properties. Candidate materials with high thermal conductivity and insulating properties include polycrystalline silicon (~45 W/mK), AlN (~280 W/mK), boron nitride, and SiC. Polycrystalline silicon has been experimentally demonstrated to be able to be polished to 0.1 nm rms roughness though the use of chemical mechanical polishing.

Ceramic substrates are typically formed by sintering or reaction bonding of powders and binders. There is the potential that impurity atoms in the material can diffuse out of the ceramic substrate and contaminate processing equipment or device material layers during high temperature process step used to fabricate devices. One method of preventing contamination of process equipment or device layers is to encapsulate the ceramic material with a CVD material layer. Material layers such as CVD silicon nitride, CVD AlN, and CVD polysilicon that coat all surfaces of the ceramic material can encapsulate the ceramic material and act as a diffusion barrier to the escape of impurities from the ceramic material. Non-single crystalline substrates that are formed by CVD, plasma, plasma spraying, or hydride vapor phase deposition will have higher purity than ceramic substrates, however, in some cases, it can be desirable to encapsulate these substrates in a similar manner.

Bonding

The back surface of the thinned wafer is bonded to the substrate using a thin bonding technique. Optionally, this may involve the step of applying a thin bonding material layer or a polymer bonding material onto the back surface of the wafer, the substrate, or both. The bonding method may be wafer bonding, or any other method of bonding a wafer to a substrate. Multiple thinned wafers at laterally separated locations can be bonded to a single substrate.

Thin bonding techniques typically produce bonds having thicknesses of about 25 µm or less or 15 µm or less. Die attach techniques typically create bonds that are thicker than 25 µm.

One approach is to bond a full wafer to a substrate. In the case that the wafer is larger than the substrate, the wafer can be reduced in size by means such as sawing or laser cutting to be compatible with the size of the substrate. It may be more economical if a large wafer is bonded to a large substrate.

Types of wafer bonding that are suitable for wafer bonding a high performance substrate to a thinned wafer include, but are not limited to, direct wafer bonding with atom-to-atom bonding, direct wafer bonding with thin bonding material layer, polymer wafer bonding, and metal direct bonding. Wafer bonding techniques that provide high bond strength at low anneal temperatures may be desired. Techniques that can provide enhanced bond strength beyond that achieved from standard hydrophilic bonding at low anneal temperatures include plasma bonding, monolayer material bonding, self assembled monolayer bonding, sodium silicate bonding, and polymer bonding. It may also be desirable for a number of application that there be a high level of thermal conductivity across the bond interface. For applications that do not require high thermal conductivity and when the wafer bonded pair will not be exposed to high process temperatures, polymer wafer bonding is suitable. The bonding may be performed at processing temperatures below the melting or releasing temperature of adhesive that attaches the front side of the wafer to the support substrate.

Wafer bonding may require a cleaning operation prior to bonding to remove particulates and hydrocarbons. Since the front surface is attached to a support, a spin chemical cleaning approach may be preferred to a dip chemical cleaning approach. In addition, dry cleaning and vapor cleaning approaches may be preferred to a dip chemical cleaning approach. A suitable cleaning procedure is to use spin cleaning with RCA1 and possibly UV ozone or oxygen plasma cleaning to remove hydrocarbons.

Direct wafer bonding with atom-to-atom bonding and direct wafer bonding with thin bonding material layer typically requires a low surface roughness on the two surfaces to be bonded. Direct wafer bonding with atom-to-atom bonding typically requires that the surface roughness of the substrates to be bonded be less than 1 nm rms. In direct wafer bonding with atom-to-atom bonding, there are direct atom-to-atom hydrogen or covalent bonds (with several angstrom bond length) formed between atoms on the two surfaces. The bond thickness may be up to 100 Å thick. Direct wafer bonding with atom-to-atom bonding can be considered as atomic bonding or direct bonding of atoms on each surface. The low surface roughness can be achieved by several approaches.

One approach is to chemical mechanical polish (CMP) the surfaces. A second potential approach is cluster ion beam flux.

Direct wafer bonding is typically performed at room temperature but can be performed at higher temperature. The use of vacuum, pressure, and temperature during the bonding process can aid the direct bonding of two substrates and in some cases allow the bonding of wafers with surface roughness slightly greater than 1 nm rms. The use of etch stop layers with high selectivity can also result in a surface with low surface roughness on the back surface of the wafer. In addition, a combination of etching to an etch stop layer followed by a chemical mechanical polish can be used to achieve a low surface roughness.

There are two primary approaches for direct bonding with atom-to-atom bonding. These are hydrophobic and hydrophilic. The hydrophobic bonding approach typically involves treating the surfaces to be bonded so that the surfaces are hydrogen terminated using a dilute HF etchant and having no native oxide on the surfaces. Thus, the hydrophobic wafer bonding approach is appropriate for those cases where current transport is desired across the bonding interface. The hydrophilic bonding approach will have a thin oxide layer at the bonding interface. Higher bond strength for a lower anneal temperature can typically be obtained for the hydrophilic wafer bonding approach than is the case for the hydrophobic wafer bond approach. The direct wafer bonding approach has a high thermal conductivity across the bonding interface. Techniques such as plasma activation of the surface to be bonded can achieve high bond energy for low anneal temperatures.

In the case of room temperature direct bond with atom-to-atom bonding, the bonds between the atoms on the two surfaces will be hydrogen-like or van der Waals bonding. After bonding at room temperature, the substrate pair may be annealed at a higher temperature to increase the bond strength. The annealing causes the bonding to change from van der Waals bonding to hydride bonding and eventually covalent bonding for sufficiently high bond anneal temperatures. In addition, techniques such as plasma and UV ozone bonding can be used to achieve high bond strength for low anneal temperatures. Since direct bonding has direct atom-to-atom bonding, there may be good thermal transport across the bonding interface. Direct bonding may provide the highest thermal transport across the bonding interface.

A key advantage of direct bonding with atom-to-atom bonding may be that since there are no organic materials at the bond interface, the wafer pair can be bonded at low temperatures (as low as room temperature) and can then can be heated to temperatures as high as 1100-1200° C. without degrading the processing tool in which the bonded wafer pair is heated or melting a material layer at the bond interface.

Another wafer bonding technique is "direct bonding with thin bonding material layer." Direct bonding with a thin bonding material layer consists of thin organic or inorganic bonding material layers or molecules "molecular direct bonding" on one or both of the surfaces to be bonded. This may enhance the bond strength for low temperature bonding anneal temperatures and in some cases allow bonding of substrates with greater than 1 nm rms surface roughness. These thin bonding material layers are generally between 0.1 nm and 10 nm thick but can be as thick as 400 nm thick. Some thin bonding material layers include thin organic layers, sodium silicate, self assembled monolayer 0.5 nm to 5 nm thick, thin Langmuir Blodgett layers, monolayer glues, polyvinyl alcohol, and glycol. The thermal conductivity across the thin inorganic and organic bonding material layer bonding interface may not be as good for the case of direct bonding without the thin bonding material layer, but the thermal conductivity may be reasonably good, especially for thicknesses less than 10 nm thick. Thus, the use of thin bonding material layer approach is appropriate when it is desired to bond a microwave insulating and thermal conductivity substrate to the back surface of thinned microelectronics and/or microwave circuits.

Another wafer bonding technique is "polymer wafer bonding." A wafer bonding technique of polymer bonding can be used to bond two substrates together. In this case, one or both of the substrates to be bonded are typically coated with polymer layers such as PMMA, polyimide, or BCB with the polymer layers having a thickness in the range of 400 nm to 15 $\mu$m, including thicknesses such 100 nm, 1 $\mu$m, 10 $\mu$m, and 15 $\mu$m. The polymer-coated substrates are placed face to face, contacted, and then annealed to increase the bond strength. Polymers have a relatively low thermal conductivity and thus the approach of polymer bonding may not be not suitable for those applications that require a high thermal conductivity across the bonding interface. Polymer bonding is suitable however to those cases where a microelectronic and/or microwave circuit layer is bonded to a microwave insulating substrate. Other wafer bonding techniques similar to polymer bonding in that there is a relativity thick layer of material at the bond interface are sol-gel layer, spin-on-glass, plastic, preceramic polymer, ceramic filled polymer, metal filled polymers, nanoparticle filled polymer, and phase change polymer material.

Another wafer bonding method is metal wafer bonding. In this approach, metal such as palladium, nickel, or platinum is deposited on of the surfaces to be bonded. The metal is placed in contact with a silicon wafer and then heated to cause the metal to react with the high performance substrate, typically forming a silicide at the bond interface. Metal bonding typically requires anneal temperatures in the range of 400-450° C. to form the silicide junctions. Gold-gold thermocompression bonding can be performed at approximately 300° C. Microwave bonding can be used to lower the temperatures that the wafer and adhesive that is attaching the wafer to the support are exposed to.

Several types of wafer bonding approaches are suitable for achieving bonding with high thermal conductivity across the bonding interface. These high thermal conductivity approaches include direct wafer bonding with atom-to-atom bonding, direct wafer bonding with a thin bonding material layer, metal direct wafer bonding. The choice of the bonding approach will depend on the surface roughness of the back surface of the wafer and the high performance substrate, and the degree of thermal conductivity that is desired across the bonding interface. The direct wafer bonding approach has a high thermal conductivity across the bonding interface. The use of thin organic material layers for bonding will typically degrade the thermal conductivity across the bond interface compared to the direct wafer bond case, however, it will allow bonding to be achieved with higher levels of surface roughness than is the case for direct wafer bonding.

In applications for microwave insulating substrates, it is may be desirable that the substrate be insulating. Thus, in this case, it is desirable that the direct wafer bonding interface or the thin organic material layer not have a significant degree of electrical conductivity. However, there are some high performance substrate approaches where it is desirable to form a metallic ground plane for the transmission lines and a ground plane to reduce analog cross talk at the wafer bonding interface.

Optionally, the method comprises annealing the wafer bonded to the substrate after the bonding step and before the removing step. This annealing may increase the bond strength. It may be desirable to increase the bond strength between the wafer and the substrate prior to removal of the wafer from the support. It may be desirable that the bond anneal temperature used have a processing temperatures below the melting or releasing temperature of adhesive that attaches the front side of the wafer to the support substrate. The softening and melting temperature of the front side adhesive may typically be in the range of 40° C. to 400° C.

Removing the Wafer

The support is then removed from the front surface of the wafer. This may be done by releasing or dissolving the temporary adhesive. A method of releasing the adhesive at the completion of processing is to heat beyond the softening point of the adhesive or to dissolve the adhesive. The optional use of perforated holes in the support can facilitate the dissolving of the adhesive.

Optionally, the method comprises cleaning the front surface of the wafer after the removing step. This may remove adhesive residue from the front surface.

Additional Processing

Optionally, the method comprises annealing the wafer bonded to the substrate after the removing step. This annealing may increase bond strength. Typical anneals may be in the range of 100° C. to 1000° C. For direct bonding with atom-to-atom bonding, high temperature anneals are possible because there are no organic or metal materials at the bond interface. The maximum anneal temperature for other wafer bonding approaches are typically limited to the melting temperature of the polymer, spin-on-glass, sol-gel, or thin bonding layer material. In some cases, it may be desirable to anneal to such a temperature that the polymer, spin-on-glass, sol-gel, thin bonding layer decomposes the organic material (such as is used for bonding with preceramic polymer material) to increase the thermal conductivity.

Optionally, the method comprises forming features on the front surface of the wafer after the removing step. The features may be of the same types as described above and may complete fabrication of microelectronic or microwave devices on the front surface. In some cases, the thinned wafer has only epitaxial material and/or several device layers when it is bonded to the substrate. This approach may be desirable because there may be less topography on the wafer surface and thus, it may be possible to thin the wafer to the selected thickness more accurately. In addition, some substrates are fragile and it may be desirable to have a strong substrate for processing of devices and circuits. Device and circuit fabrication steps such as, but not limited to, implant anneal, gate fabrication, metal interconnect fabrication, epitaxial deposition, dielectric deposition, conductor material deposition, photolithography, and etching can be performed following the wafer bonding to the substrate.

Optionally, the method comprises thinning the substrate after the bonding step. Grounding vias may also be incorporated. Transmission lines for microwaves are typically formed by thinning an insulating substrate to the range of 50 microns to 100 microns. Thus, it may be desirable to thin the high performance substrate to 30 to 100 microns during processing. Alternately, a 30 micron to 100 micron high performance substrate can be bonded to the thinned wafer and then processed. Microwave circuits often have grounding vias etched through the backside. Thinning the high performance substrate to the range of 30 microns to 100 microns may also be desirable for improved thermal conductivity.

Optionally, the method comprises cutting the substrate and bonded wafer. This may be done by sawing or dicing the microelectronic or microwave devices or circuits.

Circuits

The above method, though not limited to such, may be used to make a circuit or device comprising a substrate and a wafer; wherein the wafer is at most about 100 microns thick; wherein the wafer has a front surface comprising features; and wherein the wafer has a back surface bonded to the substrate using a thin bonding technique. The wafer may also be as thin as about 500 nm or less. The substrate may be a high performance substrate having a higher thermal conductivity and/or resistivity than the wafer. The thermal conductivity of the substrate may be about 150 W/mK or more, and the resistivity may be about 3000 ohm-cm or more. The substrate may also be as thin as about 100 µm or less.

The features on the wafer may include, but are not limited to, microelectronic and/or microwave material layers, microelectronic devices, and microelectronic circuits. There may also be features on the back surface of the wafer. The wafer and substrate may be bonded together by any thin bonding means including, but not limited to, direct wafer bonding with atom-to-atom bonding, thin bonding material layer, polymer bonding material, and metal wafer bonding. The wafer may also comprise an etch stop layer or one or more leakage current blocking insulator material layers adjacent to the substrate. There may be more than one independent circuit on the wafer.

A bulk wafer with initial thickness in the range of 350 to 800 microns may be thinned to the range of 0.5 micron to 100 microns and or even 1 micron to 20 microns thickness. Thus, for the case of a high resistivity silicon wafer, the wafer after thinning and wafer bonding may consist of approximately 1 micron to 20 microns of high resistivity silicon that is wafer bonded to an insulating, high thermal conductivity high performance substrate. It may be desirable that the high performance substrates at the completion of processing have a thickness on the order of 40 microns to 800 microns or 40 microns to 100 microns. Because the silicon wafer may be 1 to 20 microns thick and consisting of high resistivity silicon (3000-10,000 ohm-cm) and also that the substrate may be insulating and have high thermal conductivity, the combined thinned wafer and substrate may have an effective insulating property to provide low microwave losses to the microelectronic and microwave circuits. In addition, the combined thinned wafer and substrate may have high effective thermal conductivity. Similar considerations may apply to bulk GaAs and InP wafers.

The use of a wafer that includes an etch stop layer may allow thinning to a more repeatable selected thickness and also can typically allow the wafer to be thinned to a greater extent than is the case for a bulk wafer without an etch stop. Silicon-on-insulator substrates have been demonstrated with a top silicon device layer thicknesses in the range of 4 nm to 40 µm and typically have a buried oxide layer thickness in the range of 2 nm to 4000 nm. A buried oxide layer can act as an etch stop with high selectivity for etching silicon and stopping at the buried oxide and provide a high selectivity for etching the buried oxide and stopping at the silicon device layer. Future advanced silicon VLSI circuits will require SOI substrates with device silicon layer thicknesses as thin as 2 nm. Thus, a wafer that includes an oxide etch stop can be repeatably thinned to a thicknesses as small as 2 nm and wafer bonded to a high performance substrate. Such etch stop layers may be formed by epitaxial growth. In addition, ion implantation can be used to form carbon layer, silicon nitride layer, heavily boron doped layer, or PN junctions. Because the silicon wafer can be as thin as 2 nm the wafer bonded substrate is insulating and has high thermal conductivity, the combined thinned wafer and substrate may have an effective insulating property to provide low microwave losses to the microelectronic and microwave circuits. In addition, the combined thinned wafer and substrate may have high effective thermal conductivity. Similar considerations may apply to bulk GaAs and InP wafers that contain etch stop layers.

Figure 1B:
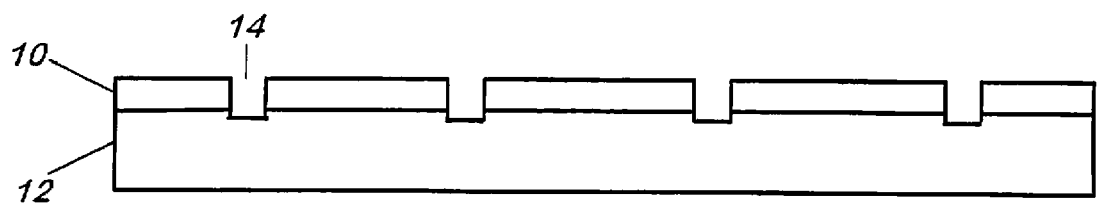
Figure 1C:
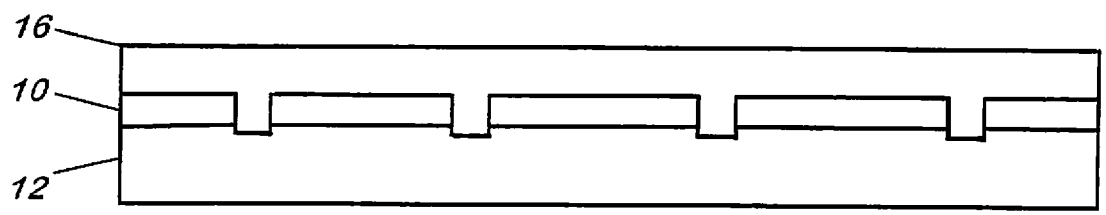
Figure 1D:
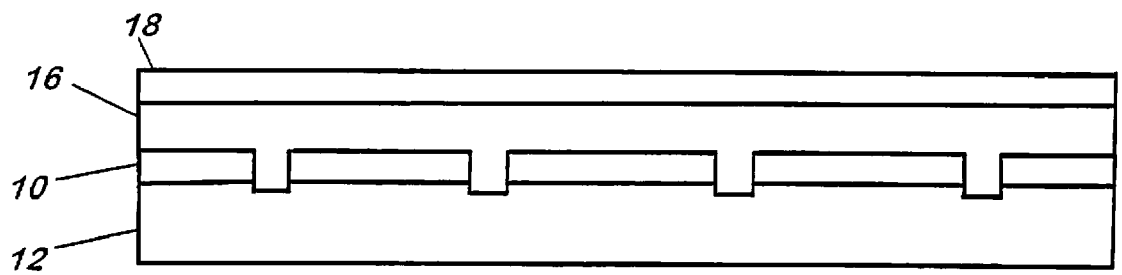
Figure 1E:
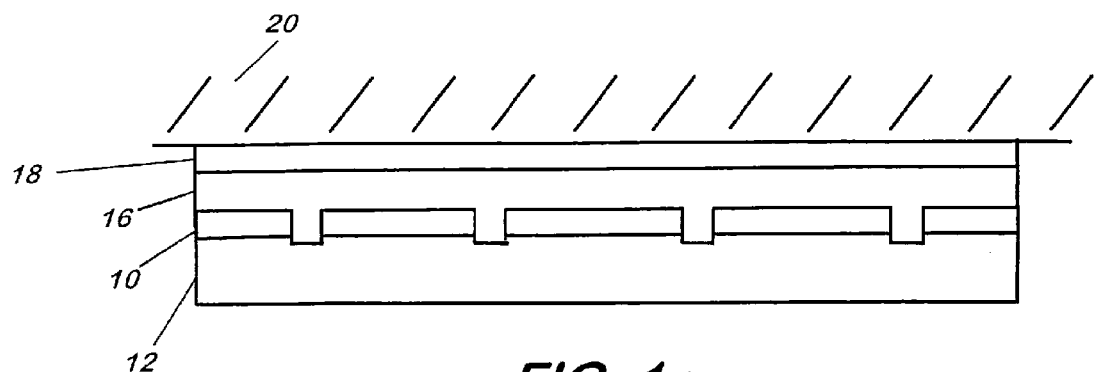
Figure 1F:
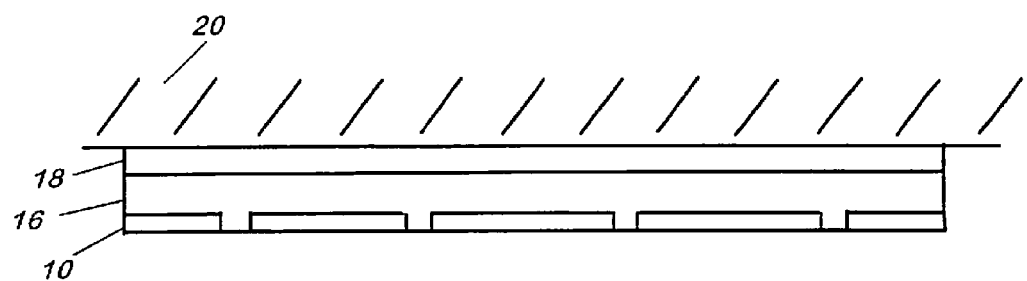
Figure 1G:
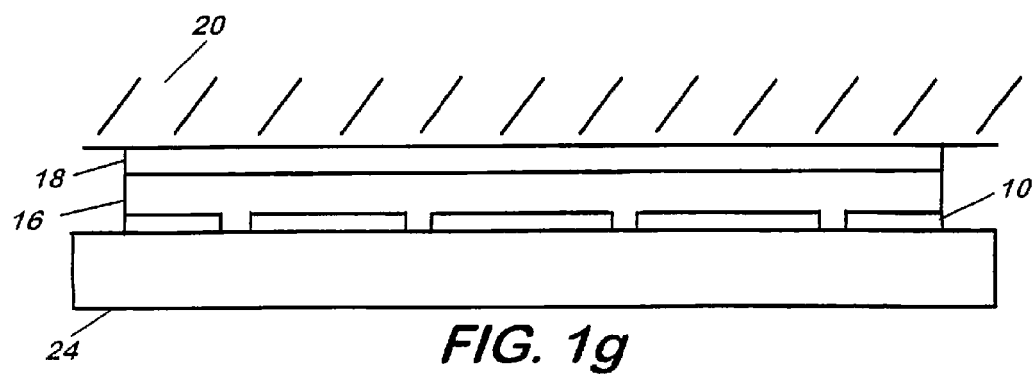
Figure 1H:
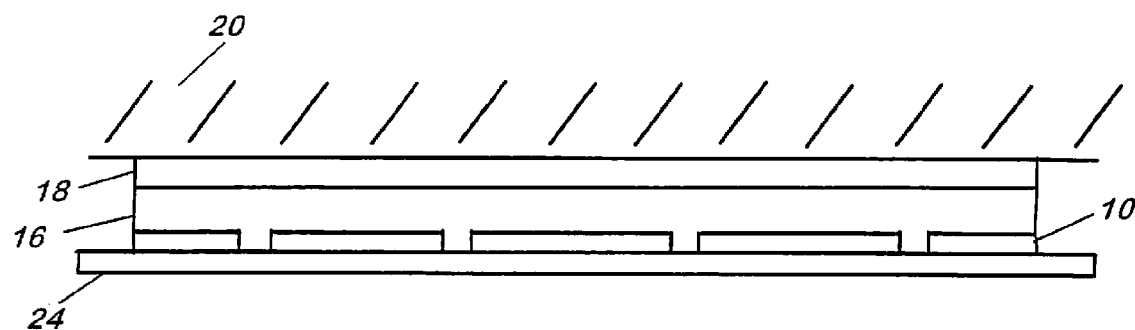
Figure 1I:
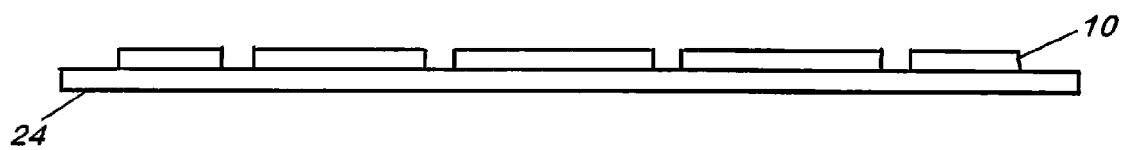
Figure 1J:
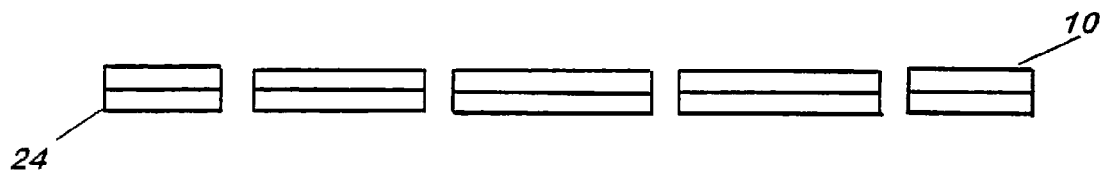

FIGS. 1a-1k schematically illustrate the steps of an embodiment of the invention. FIG. 1a shows a wafer 12 having devices, material layers, etc, represented by layer 10. FIG. 1b shows grooves 14 etched through material layers 12 to reduce stress. It not required that the grooves 14 be etched completely through the material layers 12. FIG. 1c shows a low stress material applied to the material layers 12. The low stress material may or may not fill in the grooves 14. FIG. 1d shows an adhesive 18 applied to the low stress material 16. FIG. 1e shows the assembly attached to a support 20. FIG. 1f shows the result of thinning the wafer. The bulk of the wafer 10 has been removed, leaving only islands of material layers 10. It is not required that all of the bulk 10 be removed, or that the material layers 12 be divided into islands. FIG. 1g shows a substrate 24 bonded to the wafer 10. FIG. 1h shows the result of thinning the substrate 24. FIG. 1i shows the result of removing the wafer 10 from the support 20 and cleaning off the adhesive 18 and low stress material 16. FIG. 1j shows the wafer and substrate cut apart into separate circuits. It is not required that the cutting be in the same locations as the grooves 14.

Obviously, many modifications and variations of the present invention are possible in light of the above teachings. It is therefore to be understood that the claimed invention may be practiced otherwise than as specifically described.

We claim:

1. A circuit comprising:
a substrate;
wherein the substrate is microwave insulating; and
a wafer;
wherein the wafer has a front surface comprising a microwave device and more than one independent circuits; and
wherein the wafer has a back surface directly contacted and bonded to the substrate by direct wafer bonding with atom-to-atom bonding with hydrogen or covalent bonds between atoms on the wafer and atoms on the substrate.

2. The circuit of claim 1, wherein the wafer is at most about 50 microns thick.

3. The circuit of claim 1, wherein the wafer is a silicon-on-insulator wafer.

4. The circuit of claim 1, wherein the substrate has a thermal conductivity higher than the thermal conductivity of the wafer.

5. The circuit of claim 1, wherein the substrate has a thermal conductivity of at least about 150 W/mK.

6. The circuit of claim 1, wherein the substrate has a resistivity higher than the resistivity of the wafer.

7. The circuit of claim 1, wherein the substrate has a resistivity of at least about 3000 ohm-cm.

8. The circuit of claim 1, wherein the substrate is optically transparent.

9. The circuit of claim 1, wherein the substrate is an Au, Ag, or Li doped silicon substrate.

10. The circuit of claim 1, wherein the substrate is selected from the group consisting of a composite single-crystal substrate, a composite polycrystalline layer on a single crystal substrate, non-single crystal substrate, and a single-crystal substrate.

11. The circuit of claim 1, wherein the wafer is at most about 20 μm thick.

12. The circuit of claim 1, wherein the wafer is at most about 500 nm thick.

13. The circuit of claim 1, wherein the substrate is semi-insulating.

14. The circuit of claim 1, wherein the substrate is a gold-doped silicon substrate.

* * * * *